(12) United States Patent
Consiglio et al.

(10) Patent No.: US 10,991,881 B2
(45) Date of Patent: Apr. 27, 2021

(54) METHOD FOR CONTROLLING THE FORMING VOLTAGE IN RESISTIVE RANDOM ACCESS MEMORY DEVICES

(71) Applicants: TOKYO ELECTRON LIMITED, Tokyo (JP); INTERNATIONAL BUSINESS MACHINES CORPORATION, Armonk, NY (US)

(72) Inventors: Steven Consiglio, Albany, NY (US); Cory Wajda, Albany, NY (US); Kandabara Tapily, Albany, NY (US); Takaaki Tsunomura, Albany, NY (US); Takashi Ando, Tuckahoe, NY (US); Paul C. Jamison, Hopewell Junction, NY (US); Eduard A. Cartier, New York, NY (US); Vijay Narayanan, New York, NY (US); Marinus J. P. Hopstaken, Carmel, NY (US)

(73) Assignee: Tokyo Electron Limited, Tokyo (JP)

( * ) Notice: Subject to any disclaimer, the term of this patent is extended or adjusted under 35 U.S.C. 154(b) by 63 days.

(21) Appl. No.: 16/428,554

(22) Filed: May 31, 2019

(65) Prior Publication Data
US 2020/0381624 A1    Dec. 3, 2020

(51) Int. Cl.
*H01L 45/00*    (2006.01)
*H01L 27/24*    (2006.01)
(52) U.S. Cl.
CPC .......... *H01L 45/1616* (2013.01); *H01L 27/24* (2013.01); *H01L 45/146* (2013.01)

(58) Field of Classification Search
CPC .... H01L 45/1616; H01L 45/146; H01L 27/24
See application file for complete search history.

(56) References Cited

U.S. PATENT DOCUMENTS 8,921,214 B2 * 12/2014 Lee ........................ H01L 45/146
                                                       438/513
2013/0140511 A1    6/2013 Chiang et al.
2013/0207105 A1    8/2013 Miller et al.
(Continued)

FOREIGN PATENT DOCUMENTS

KR    10-2011-0030162 A    3/2011

OTHER PUBLICATIONS

Korean Intellectual Property Office, International Search Report and Written Opinion for International application No. PCT/US020/035101, dated Sep. 11, 2020, 11pp.
(Continued)

*Primary Examiner* — Karen Kusumakar (57) ABSTRACT

A method of controlling the forming voltage of a dielectric film in a resistive random access memory (ReRAM) device. The method includes depositing a dielectric film contains intrinsic defects on a substrate, forming a plasma-excited treatment gas containing $H_2$ gas, and exposing the dielectric film to the plasma-excited treatment gas to create additional defects in the dielectric film without substantially changing a physical thickness of the dielectric film, where the additional defects lower the forming voltage needed for generating an electrically conducting filament across the dielectric film. The dielectric film can include a metal oxide film and the plasma-excited treatment gas may be formed using a microwave plasma source.

17 Claims, 6 Drawing Sheets

(56) References Cited

U.S. PATENT DOCUMENTS

2013/0295745 A1 11/2013 Takahashi et al.
2014/0269004 A1 9/2014 Pramanik et al.

OTHER PUBLICATIONS

Gao, Bin et al. "Metal oxide resistive random access memory based synaptic devices for brian-inspired computing", Jpn. J. Applied Phys. 55 (2016) 04EA06-1-04EA06-7.

Islam, Raisul et al. "Device and materials requirements for neuromorphic computing" J. Phys. D: Appl. Phys. 52 (2019) 113001.

Matveyev, Yu et al. "Resistive switching and synaptic properties of fully atomic layer deposition grown TiN/HfO2/Tin devices" J. Appl. Phys. 117 (2015) 044901-1-044901-7.

Sawa, Akihito "Resistive switching in transition metal oxides" Materials Today 11(6) Jun. 2008, 28-36.

\* cited by examiner

METHOD FOR CONTROLLING THE FORMING VOLTAGE IN RESISTIVE RANDOM ACCESS MEMORY DEVICES

FIELD OF THE INVENTION

The present invention relates to semiconductor processing and semiconductor devices, and more particularly, to resistive random access memory (ReRAM) devices and method of making.

BACKGROUND OF THE INVENTION

ReRAM devices are a class of storage memory devices that have received much attention due to the potential payout toward high-density/low-cost/low-energy non-volatile memories. The basic idea behind ReRAM devices is that a dielectric film which is normally insulating, can be made to conduct current through a filament or conduction path formed after application of a sufficiently high voltage across a thickness of the film, known as the forming voltage. The conduction path can arise from different mechanisms, including vacancy or metal defect migration. In general, the forming voltage can be linearly decreased by reducing the thickness of the dielectric film, but it is difficult to adjust the forming voltage without changing the dielectric film thickness. Further, changing the dielectric film thickness may cause other device performance problems, or require switching to a different dielectric material. Therefore, methods are needed for adjusting the forming voltage without substantially affecting the dielectric film thickness.

SUMMARY OF THE INVENTION

Embodiments of the invention provide a method of controlling the forming voltage of a dielectric film by post-deposition processing of the dielectric film. The dielectric film can, for example, form a portion of a ReRAM device.

According to one embodiment, a method of forming a ReRAM device includes depositing a dielectric film containing intrinsic defects on a substrate, forming a plasma-excited treatment gas containing $H_2$ gas, and exposing the dielectric film to the plasma-excited treatment gas to create additional defects in the dielectric film without substantially changing a physical thickness of the dielectric film, where the additional defects lower the forming voltage needed for generating an electrically conducting filament across the dielectric film. In one example, the dielectric film includes a metal oxide dielectric film and the exposing includes exciting the treatment gas using a microwave plasma source. In some examples, the treatment gas consists of $H_2$ gas, or $H_2$ gas and Ar gas.

According to another embodiment, a ReRAM device is described that includes a dielectric film containing intrinsic defects, and additional defects created by exposing the dielectric film to plasma-excited treatment gas containing $H_2$ gas, where the additional defects in the dielectric film are created without substantially changing a physical thickness of the dielectric film, and where the additional defects lower the forming voltage needed for generating an electrically conducting filament across the dielectric film. In one example, the dielectric film includes a metal oxide film that may be selected from the group consisting of $HfO_2$, $ZrO_2$, $TiO_2$, $NiO$, $Al_2O_3$, $Ta_2O_5$, and laminate films thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Embodiments of the invention provide a method for controlling the forming voltage of a dielectric film by post-deposition processing of the dielectric film. The dielectric film can, for example, form a portion of a ReRAM device that includes a laminate of a first electrode film (e.g., TiN), a dielectric film, and a second electrode film (e.g., TiN). The post-deposition processing includes plasma treating the dielectric film where the plasma treating provides highly controllable controlling of the forming voltage without significantly reducing the thickness of the dielectric film or changing other important dielectric parameters. In ReRAM devices, the resistive switching is controlled by the formation and dissolution of a conductive filament in the dielectric film. For metal oxide dielectric films, the switching mechanism is attributed to the movement of charged oxygen vacancies that act as local dopants.

According to one embodiment, a method is described for forming a ReRAM device, where the method includes depositing a dielectric film containing intrinsic defects on a substrate, forming a plasma-excited treatment gas containing $H_2$ gas, and exposing the dielectric film to the plasma-excited treatment gas to create additional defects in the dielectric film, where the additional defects lower the forming voltage needed for generating an electrically conducting filament across the dielectric film.

According to another embodiment, the method includes depositing a dielectric film containing intrinsic defects on a substrate, forming a plasma-excited treatment gas containing $H_2$ gas, exposing the dielectric film to the plasma-excited treatment gas to create additional defects in the dielectric film, and applying a forming voltage for generating an electrically conducting filament across the dielectric film, where the additional defects lower the forming voltage needed for generating the electrically conducting filament.

Figure 1A:
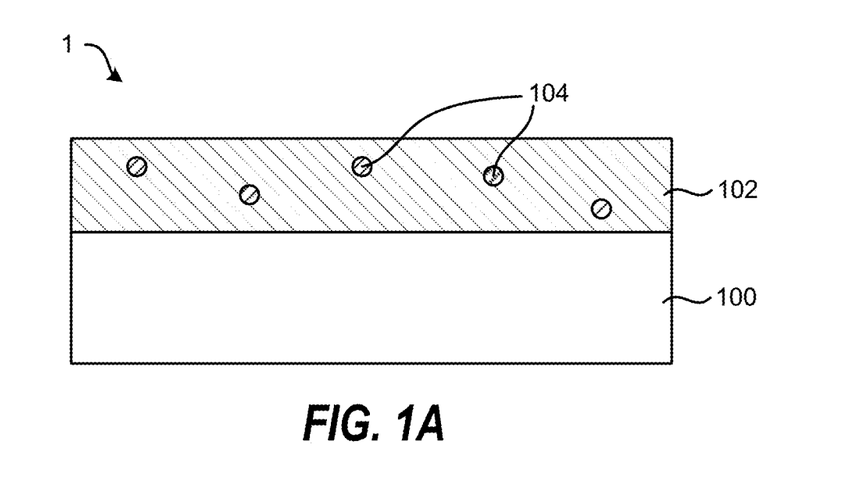
FIGS. 1A and 1B schematically show a method of controlling the forming voltage of a film structure according to an embodiment of the invention.
Figure 1B:
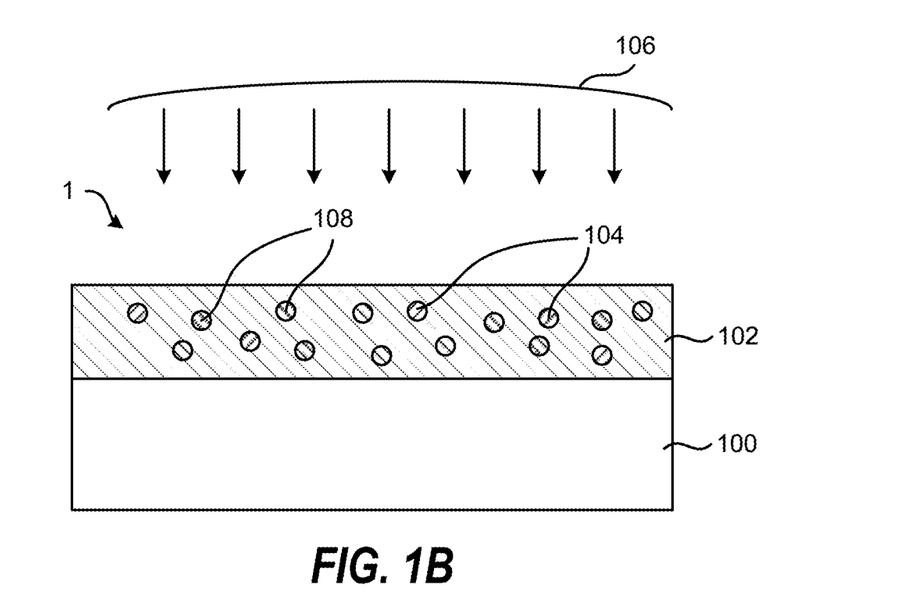

FIGS. 1A and 1B schematically show a method of controlling the forming voltage of film structure according to an embodiment of the invention. FIG. 1A shows a film structure 1 that includes a substrate 100 and a dielectric film 102 on the substrate 100. The substrate 100 can include a first electrode film (e.g., TiN) on a base material (e.g., an interlayer dielectric film). The dielectric film 102 may be deposited by vapor phase deposition, for example atomic layer deposition (ALD) or chemical vapor deposition (CVD). The dielectric film 102 contains intrinsic defects 104, also known as stoichiometric defects, that can be caused by ion dislocations and/or ion vacancies formed during deposition or formation of the dielectric film 102. In one example, an as-deposited metal oxide dielectric film can include intrinsic defects such as oxygen vacancies, oxygen dislocations, or both. The dielectric film 102 can, for example, include a metal oxide film selected from the group consisting of $HfO_2$, $ZrO_2$, $TiO_2$, NiO, $Al_2O_3$, $Ta_2O_5$, and laminate films thereof. In some examples, a thickness of the dielectric film 102 can be between about 2 nm and about 20 nm, between about 2 nm and about 10 nm, between about 2 nm and about 5 nm, between about 5 nm and about 20 nm, or between about 10 nm and about 20 nm.

FIG. 1B shows the film structure 1 during a gaseous exposure to a plasma-excited treatment gas. In some examples, the treatment gas 106 can contain or consist of $H_2$ gas, or $H_2$ gas and a noble gas (e.g., Ar). The plasma exposure introduces additional defects 108 in the dielectric film 102 without significantly changing the physical thickness of the dielectric film 102. The resulting dielectric film 102 contains the intrinsic defects 104 and the additional defects 108. Further, when using only $H_2$ gas, or $H_2$ gas and Ar gas, only $H_2$ (or H), or $H_2$ (or H) and Ar, are introduced into the dielectric film 102 by the plasma exposure. The plasma exposure and the lowering of the forming voltage is highly controllable and the processing conditions (e.g., plasma source power, exposure time, and substrate temperature) may be selected such that a controlled number of the additional defects 108 is introduced in the dielectric film 102. According to one embodiment, a microwave plasma source may be used for the plasma excitation. An exemplary microwave plasma source is described in FIGS. 5-7. The microwave plasma source generates a plasma with low electron temperature and high electron density to effectively introduce the additional defects 108 in the dielectric film 102 without substantially changing a thickness the dielectric film 102 or seriously damaging the dielectric film 102. The microwave plasma is thus well suited for highly controllable introduction of the additional defects 108 in the dielectric film 102. According to another embodiment, a capacitively coupled plasma (CCP) source or an inductively coupled plasma (ICP) source may be used for the plasma excitation.

In some examples, the plasma exposure of the dielectric film 102 may be performed at a substrate temperature of about 200° C., or greater, for example between about 200° C. and about 500° C., between about 200° C. and about 300° C., between about 300° C. and about 400° C., between about 300° C. and about 500° C., between about 400° C. and about 500° C. In one example, the substrate temperature may be about 400° C.

According to one embodiment, processing conditions during the plasma exposure can include a substrate temperature of about 400° C., process chamber pressure of about 0.95 Torr, and microwave power of about 1700 W.

According to one embodiment, the deposition and post-deposition processing of the dielectric film may be performed by interrupting the deposition of the dielectric film at least once and performing the plasma exposure before continuing the deposition of the dielectric film. This is schematically shown in FIGS. 2A-2C.

Figure 2A:
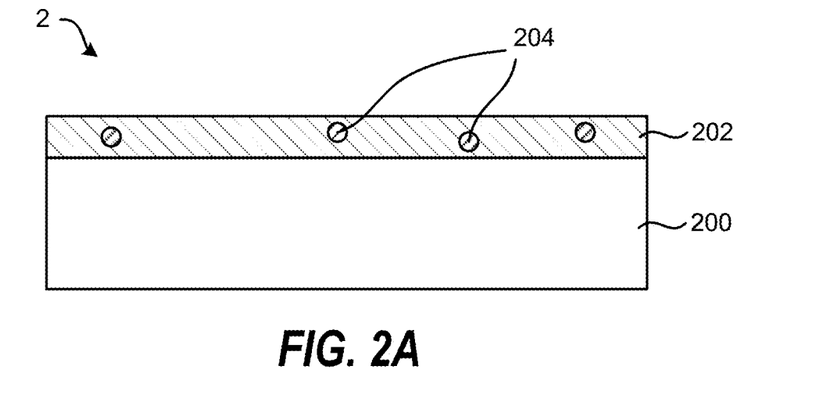
FIGS. 2A-2C schematically show a method of controlling the forming voltage of a film structure according to another embodiment of the invention.
Figure 2B:
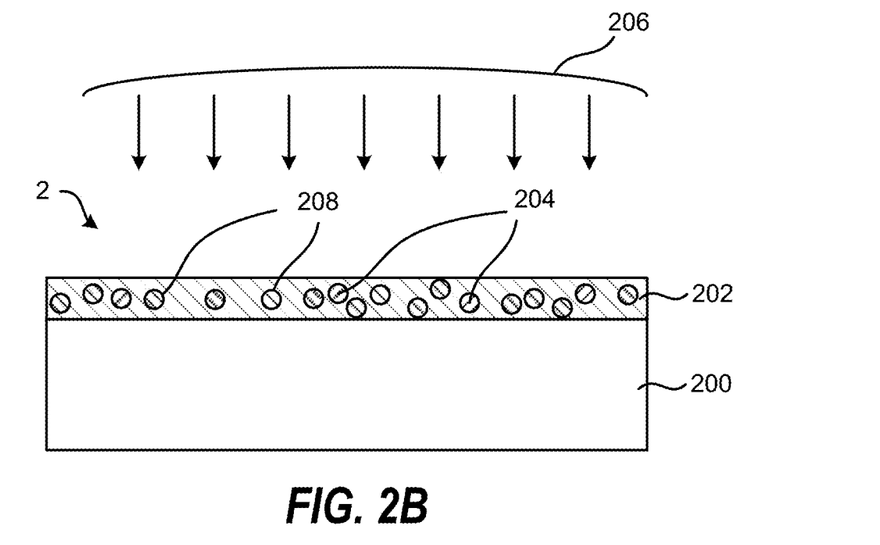
Figure 2C:
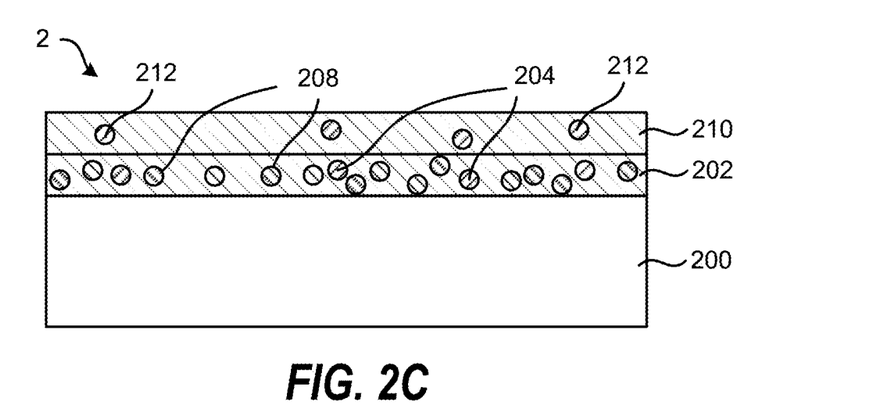

FIGS. 2A-2C schematically show a method of controlling the forming voltage of a film structure according to an embodiment of the invention. The film structure 2 is similar to the film structure 1 in FIG. 1A and includes a substrate 200 and a dielectric film 202 deposited or formed on the substrate 200. The substrate 200 can include a first electrode film (e.g., TiN) on a base material (e.g., an interlayer dielectric film). The dielectric film 202 can be thinner than the dielectric film 102 in FIG. 1A and contains intrinsic defects 204. The dielectric film 202 can, for example, include a high-k metal oxide selected from the group consisting of $HfO_2$, $ZrO_2$, $TiO_2$, NiO, $Al_2O_3$, $Ta_2O_5$, and laminate films thereof. In some examples, a thickness of the dielectric film 202 can be between about 1 nm and about 10 nm, between about 2 nm and about 10 nm, between about 2 nm and about 5 nm, between about 5 nm and about 10 nm, or between about 5 nm and about 20 nm.

FIG. 2B shows the film structure 2 during a gaseous exposure to a plasma-excited treatment gas 206. In some examples, the treatment gas 206 can contain or consist of $H_2$ gas, or $H_2$ gas and a noble gas (e.g., Ar). The plasma exposure introduces additional defects 208 in the dielectric film 202 without significantly changing the physical thickness of the dielectric film 202. The resulting dielectric film 202 contains the intrinsic defects 204 and the additional defects 208. Further, when using only $H_2$ gas, or $H_2$ gas and Ar gas, only $H_2$(or H), or $H_2$(or H) and Ar, are introduced into the dielectric film 202 by the plasma exposure. The plasma exposure and the forming voltage reduction is highly controllable and the processing conditions (e.g., plasma source power, exposure time, and substrate temperature) may be selected such that a controlled number of the additional defects 208 is introduced in the dielectric film 202. According to one embodiment, a microwave plasma source may be used for the plasma excitation. According to another embodiment, a CCP source or an ICP source may be used for the plasma excitation.

FIG. 2C shows the film structure 2 following deposition of an additional dielectric film 210 on the dielectric film 202, where the additional dielectric film 210 contains intrinsic defects 212. In one example, the additional dielectric film 210 may contain the same dielectric material as the dielectric film 202. In another example, the additional dielectric film 210 may contain a different dielectric material than the dielectric film 202. According to one embodiment, an additional plasma exposure performed on the additional dielectric film 210 to introduce further additional defects in the additional dielectric film 210.

Figure 3A:
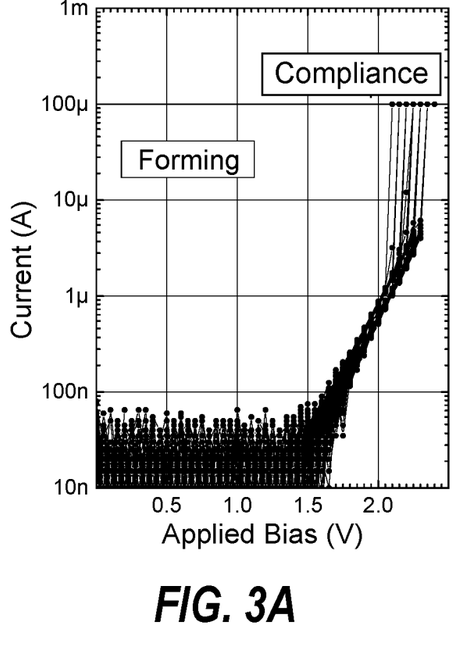
FIGS. 3A and 3B show the steps of Forming, Reset, and Set for a ReRAM device according to embodiments of the invention.
Figure 3B:
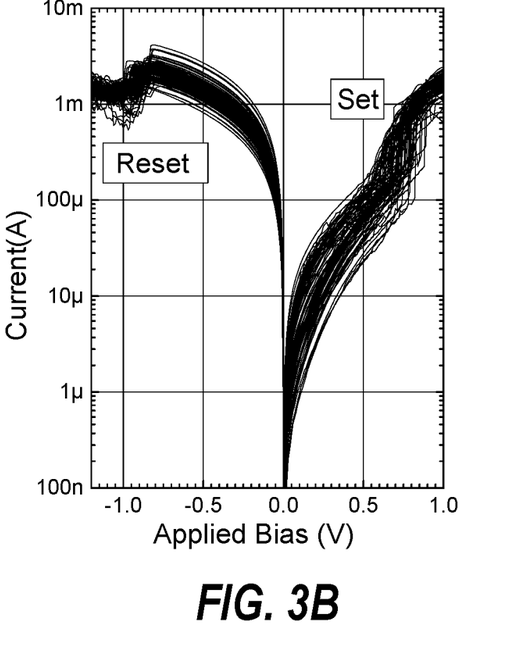

FIGS. 3A and 3B show the steps of Forming, Reset, and Set for a ReRAM device according to embodiments of the invention. FIG. 3A shows experimental results for forming a current conducting filament in a dielectric film for a ReRAM device. During the Forming step, the initial leakage current through the ReRAM stack is low, but abrupt increase in leakage current occurs with increasing applied bias voltage across the dielectric film. The leakage current reaches a compliance current set by an external device, such as transistor. In the example in FIG. 3A, the compliance current is about 100 µA.

FIG. 3B shows experimental results for Reset and Set steps for a ReRAM device. In the forming step in FIG. 3A, a current conducting filament was formed and the device was set to a low resistance state. During a subsequent voltage sweep toward the opposite polarity, transition to a high resistance state occurs at a certain threshold voltage as shown in FIG. 3B. This operation is called Reset and it breaks the filament. Then, the device resistance can be set back to a low resistance state by sweeping the voltage toward the opposite polarity from Reset. This operation is called Set. Less applied bias voltage is needed in the Set step than in the Forming step, because the Set step does not have to grow the whole filament, just reestablish the connection.

Figure 4:
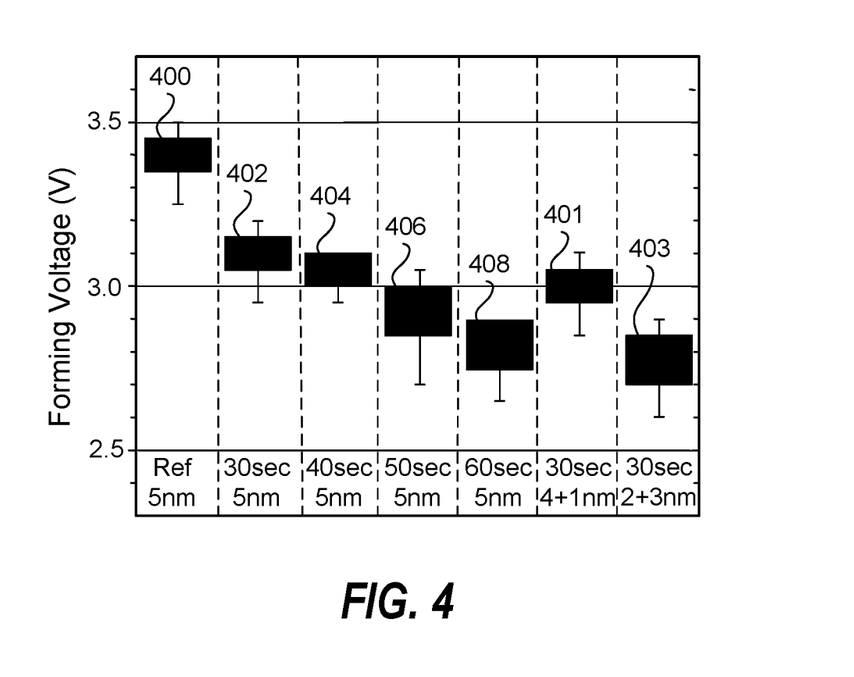
FIG. 4 shows measured forming voltage for $HfO_2$ dielectric films in a metal-insulator-metal capacitor of area 10×10 microns modified by plasma processing according to embodiments of the invention.

FIG. 4 shows measured forming voltage for $HfO_2$ dielectric films modified by plasma processing according to embodiments of the invention. The $HfO_2$ dielectric films all had a thickness of about 5 nm and the metal-insulator-metal capacitor area was 10×10 microns. For a $HfO_2$ dielectric film, the intrinsic defects and the additional defects introduced by post-deposition processing form a conducting filament when oxygen vacancies line up across the $HfO_2$ dielectric film and the forming voltage is strongly influenced by the total number of the intrinsic defects and the additional defects.

In FIG. 4, the $HfO_2$ dielectric films 402, 404, 406, and 408 were processed as described by the method in FIGS. 1A and 1B, and the $HfO_2$ dielectric films 401 and 403 were processed as described by the method in FIGS. 2A-2C. The $HfO_2$ dielectric films were deposited using alternating gaseous exposures of $Hf(NEtMe)_4$ and $H_2O$ in a thermal ALD process at a substrate temperature of about 300° C.

The $HfO_2$ dielectric film 400 was an as-deposited reference sample that was not post-deposition processed and had a measured forming voltage of about 3.4V. The $HfO_2$ dielectric films 402-408 were exposed to a microwave plasma-excited treatment gas consisting of $H_2$ gas and Ar gas. The plasma exposures for the $HfO_2$ dielectric films 402, 404, 406, and 408 were carried out for 30 sec, 40 sec, 50 sec, and 60 sec, respectively. The measured forming voltages for the $HfO_2$ dielectric films 402-408 monotonically decreased from about 3.1V to about 2.85V.

The $HfO_2$ dielectric film 401 was prepared by depositing 4 nm of a first $HfO_2$ dielectric film on a substrate, exposing the first $HfO_2$ dielectric film for 30 sec to a microwave plasma-excited treatment gas consisting of $H_2$ gas and Ar gas and, thereafter, depositing an additional 1 nm of a second $HfO_2$ dielectric film on the first $HfO_2$ dielectric film. $HfO_2$ dielectric film 403 was prepared by depositing 2 nm of a first $HfO_2$ dielectric film on a substrate, exposing the first dielectric $HfO_2$ material for 30 sec to a microwave plasma-excited treatment gas consisting of $H_2$ gas and Ar gas and, thereafter, depositing additional 3 nm of a second $HfO_2$ dielectric film on the first $HfO_2$ dielectric film. The measured forming voltages for the $HfO_2$ dielectric films 401-403 following the plasma treating and deposition of the second $HfO_2$ dielectric films were about 3.0V and about 2.8V, respectively.

The experimental results in FIG. 4 show that the forming voltage for the 5 nm thick $HfO_2$ dielectric films was controllably lowered from about 3.4V to about 2.8V using plasma exposures between 30 sec and 60 sec. Further, the forming voltage was more effectively lowered by interrupting the deposition of the $HfO_2$ dielectric material when the first $HfO_2$ dielectric film has reached an initial thickness, performing plasma exposure on the first $HfO_2$ dielectric film, and depositing a second $HfO_2$ dielectric film until a desired thickness is reached (i.e., 5 nm). It was observed that the forming voltage was more effectively lowered the thinner the first $HfO_2$ dielectric film thickness was.

Secondary ion mass spectrometry (SIMS) depth profiles of plasma treated $HfO_2$ dielectric films showed clear increase in hydrogen (H) concentration when compared to the reference samples.

The effect of substrate temperature during the plasma treating showed that substrate temperatures greater than about 300° C. were more effective for lowering the forming voltage of the $HfO_2$ dielectric films than temperatures equal to or less than about 300° C. For example, substrate temperatures of about 350° C. were more effective than substrate temperatures of about 300° C., and substrate temperatures of about 400° C. were more effective than substrate temperatures of about 350° C.

Figure 5:
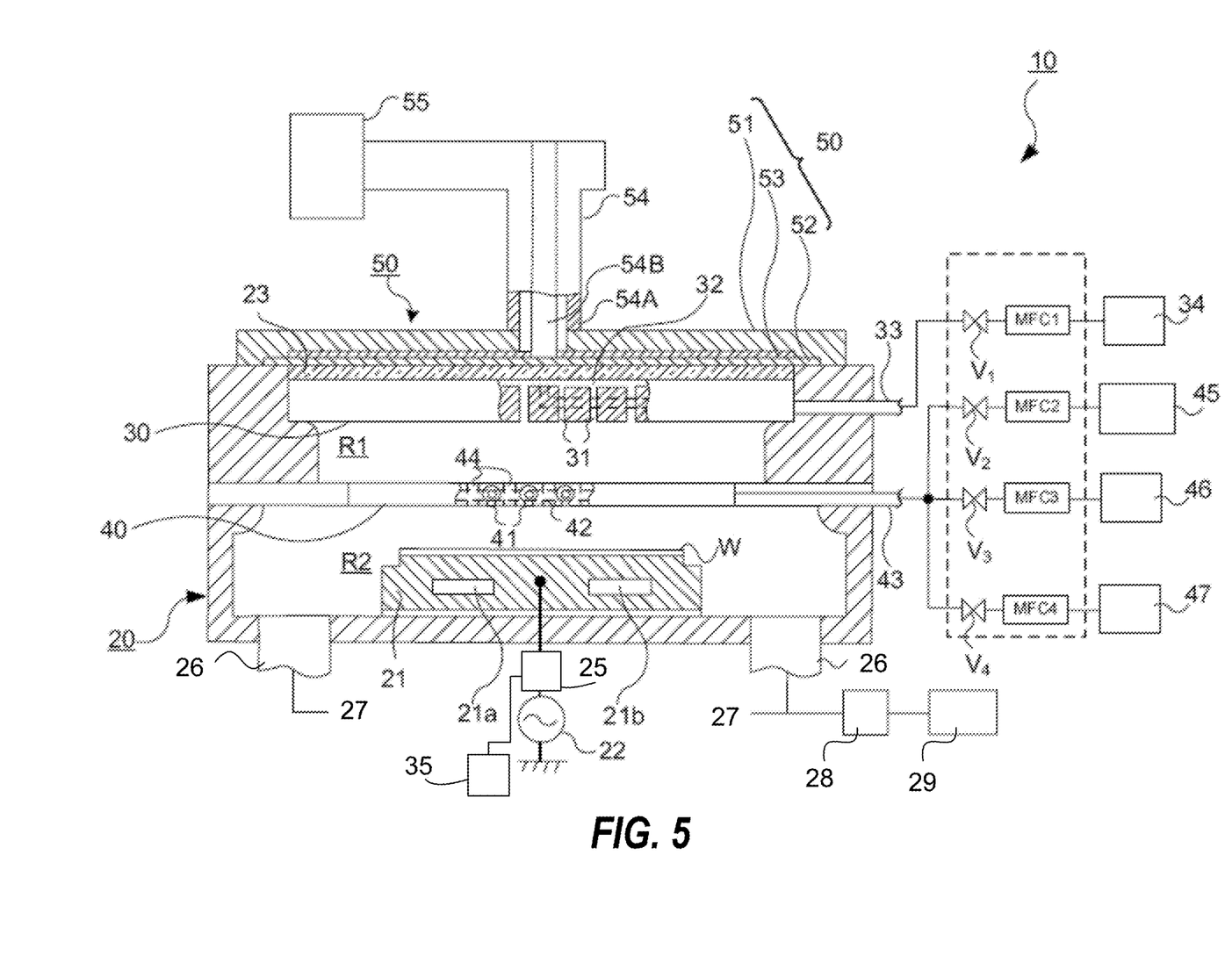
FIGS. 5-7 are schematic diagrams of a microwave plasma processing system containing a RLSA™ plasma source.
Figure 6:
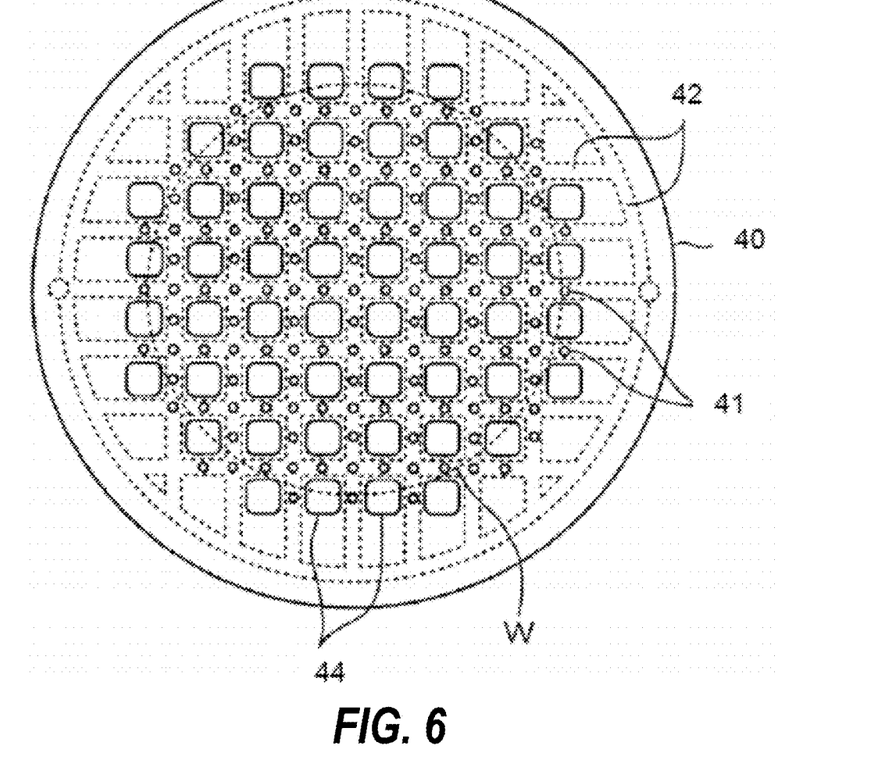
Figure 7:
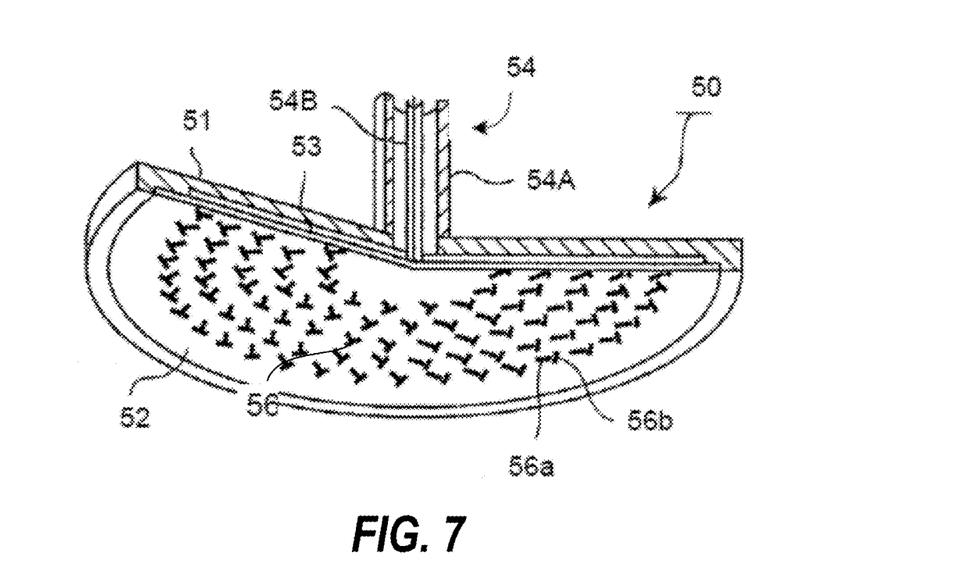
Figure 8:
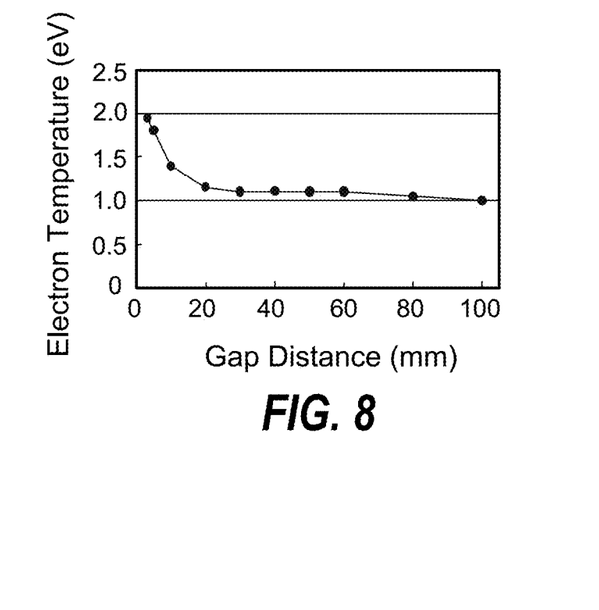
FIG. 8 shows the electron temperature versus gap distance for a microwave plasma processing system.
Figure 9:
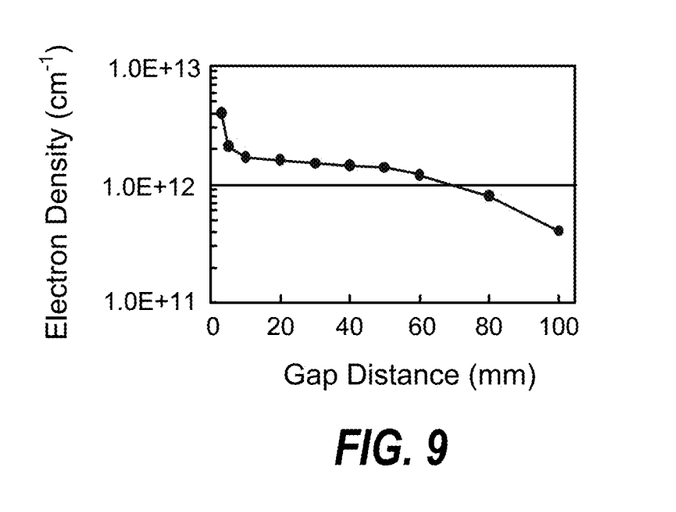
FIG. 9 shows the electron density versus gap distance for a microwave plasma processing system.

FIGS. 5-7 are schematic diagrams of a microwave plasma processing system containing a RLSA™ plasma source, available from Tokyo Electron Limited, Akasaka, Japan. As shown in FIG. 5, the plasma processing system 10 includes a plasma processing chamber 20 (vacuum chamber), an antenna unit 50, and a substrate holder 21. Inside of the plasma processing chamber 20 is roughly sectionalized into a plasma generation region R1, located below a plasma gas supply unit 30, and a plasma diffusion region R2 above the substrate holder 21. A plasma generated in the plasma generation region R1 can have an electron temperature of several electron volts (eV). When the plasma is diffused into the plasma diffusion region R2, where the film processing is performed, the electron temperature of the plasma near the substrate holder 21 may drop to a value between about 1 eV and about 2 eV. This low electron temperature is shown in FIG. 8 as a function of the gap distance between the process gas supply unit 40 and the substrate holder 21. Furthermore, as shown in FIG. 9, the electron density in the plasma diffusion region R2 can be greater than about $1.0E+12$ $cm^{-1}$ for a gap distance of less than about 70 mm, The substrate holder 21 is located centrally on a bottom portion of the plasma processing chamber 20 and serves as a substrate holder for supporting a substrate W. Inside the substrate holder 21, there is provided an insulating member 21a, a cooling jacket 21b, and a temperature control unit (not shown) for controlling the substrate temperature.

A top portion of the plasma processing chamber 20 is open-ended. The plasma gas supply unit 30 is placed opposite to the substrate holder 21 and is attached to the top portion of the plasma processing chamber 20 via sealing members such as O rings (not shown). The plasma gas supply unit 30, which may also function as a dielectric window, can be made of materials such as aluminum oxide or quartz and has a planar surface. A plurality of gas supply holes 31 are provided opposite the substrate holder 21 on a planar surface of the plasma gas supply unit 30. The plurality of gas supply holes 31 communicate with a plasma gas supply port 33 via a gas flow channel 32. A plasma gas supply source 34 provides a plasma gas, for example argon Ar gas, $H_2$ gas, or both Ar and $H_2$, or other gases, into the plasma gas supply port 33. The plasma gas is then uniformly supplied into the plasma generation region R1 via the plurality of gas supply holes 31.

The plasma processing system 10 further includes the process gas supply unit 40, which is centered in the plasma processing chamber 20 between the plasma generation region R1 and the plasma diffusion region R2. The process gas supply unit 40 may be made of a conducting material, for example an aluminum alloy that includes magnesium (Mg), or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21.

The plasma processing chamber 20 further includes exhaust lines 26 connected to the bottom portion of the plasma processing chamber 20, a vacuum line 27 connecting the exhaust lines 26 to a pressure controller valve 28 and to a vacuum pump 29. The pressure controller valve 28 may be used to achieve a desired gas pressure in the plasma processing chamber 20.

A plan view of the process gas supply unit 40 is shown in FIG. 6. As shown in this figure, grid-like gas flow channels 42 are formed within the process gas supply unit 40. The grid-like gas flow channels 42 communicate with an upper-end of the plurality of gas supply holes 41, which are formed in the vertical direction. The lower portion of the plurality of gas supply holes 41 are openings facing the substrate holder 21. The plurality of gas supply holes 41 communicate with a process gas supply port 43 via the grid-patterned gas flow channels 42.

Further, a plurality of openings 44 are formed in the process gas supply unit 40 such that the plurality of openings 44 pass through the process gas supply unit 40 in the vertical direction. The plurality of openings 44 introduce the plasma gas, e.g., Ar, $H_2$, or other gases, into the plasma diffusion region R2 above the substrate holder 21. As shown in FIG. 6, the plurality of openings 44 are formed between adjacent gas flow channels 42. The process gas may be supplied from three separate process gas supply sources 45-47 to the process gas supply port 43. The process gas supply sources 45-47 may supply $H_2$ gas, $N_2$ gas, and Ar gas.

The process gas flows through the grid-like gas flow channels 42 and is uniformly supplied into the plasma diffusion region R2 via the plurality of gas supply holes 41. The plasma processing system 10 further includes four valves (V1-V4) and four mass flow rate controller (MFC1-MFC4) for controlling a supply of the process gas.

An external microwave generator 55 provides a microwave of a predetermined frequency, to the antenna unit 50 via a coaxial waveguide 54. The coaxial waveguide 54 may include an inner conductor 54B and an outer conductor 54A. The microwave from the microwave generator 55 generates an electric field just below the plasma gas supply unit 30 in the plasma generation region R1, which in turn causes excitation of the process gas within the plasma processing chamber 20. The microwave power can, for example, be between about 0.5 $W/cm^2$ and about 4 $W/cm^2$. Alternatively, the microwave power can be between about 0.5 $W/cm^2$ and about 3 $W/cm^2$. The microwave irradiation may contain a microwave frequency of about 300 MHz to about 10 GHz, for example about 2.45 GHz.

FIG. 7 illustrates a partial cross-sectional view of the antenna unit 50. As shown in this figure, the antenna unit 50 may include a flat antenna main body 51, a radial line slot plate 52, and a dielectric plate 53 to shorten the wavelength of the microwave. The flat antenna main body 51 can have a circular shape with an open-ended bottom surface. The flat antenna main body 51 and the radial line slot plate 52 can be made of a conductive material.

A plurality of slots 56 are provided on the radial line slot plate 52 to generate a circularly polarized wave. The plurality of slots 56 are arranged in a substantially T-shaped form with a small gap between each slot. The plurality of slots 56 are arranged in a concentric circle pattern or a spiral pattern along a circumferential direction. Since the slots 56a and 56b are perpendicular to each other, a circularly polarized wave containing two orthogonal polarized components is radiated, as a plane wave, from the radial line slot plate 52.

The dielectric plate 53 can be made of a low loss dielectric film, e.g., aluminum oxide ($Al_2O_3$) or silicon nitride ($Si_3N_4$), that is located between the radial line slot plate 52 and the flat antenna main body 51. The radial line slot plate 52 may be mounted on the plasma processing chamber 20 using sealing members (not shown), such that the radial line slot plate 52 is in close contact with a cover plate 23. The cover plate 23 is located on the upper surface of plasma gas supply unit 30 and is formed from a microwave transmissive dielectric film such as aluminum oxide ($Al_2O_3$).

An external high-frequency power supply source 22 is electrically connected to the substrate holder 21 via a matching network 25. The external high-frequency power supply source 22 generates an RF bias power of a predetermined frequency, e.g. 13.56 MHz, for controlling the energy of ions in the plasma that are drawn to the substrate W. The power supply source 22 is further configured to optionally provide pulsing of the RF bias power. The pulsing frequency can be greater than 1 Hz, for example 2 Hz, 4 Hz, 6 Hz, 8 Hz, 10 Hz, 20 Hz, 30 Hz, 50 Hz, or greater. The power supply source 22 is configured for supplying RF bias power between 0 W and 100 W, between 100 W and 200 W, between 200 W and 300 W, between 300 W and 400 W, or between 400 W and 500 W. One skilled in the art will appreciate that the power levels of the power supply source 22 are related to the size of the substrate being processed. For example, a 300 mm Si wafer requires greater power consumption than a 200 mm wafer during processing. The plasma processing system 10 further includes DC voltage generator 35 capable of supplying DC voltage bias between −5 kV and +5 kV to the substrate holder 21.

A plurality of embodiments for controlling the forming voltage of ReRAM devices by plasma exposure to a treatment gas have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a resistive random access memory (ReRAM) device, the method comprising:
    depositing a dielectric film containing intrinsic defects on a substrate;
    forming a plasma-excited treatment gas containing $H_2$ gas;
    exposing the dielectric film to the plasma-excited treatment gas to create additional defects in the dielectric film, where the additional defects lower the forming voltage needed for generating an electrically conducting filament across the dielectric film;
    following the exposing the dielectric film to the plasma-excited treatment gas, depositing an additional dielectric film on the dielectric film; and
    exposing the additional dielectric film to additional plasma-excited treatment gas containing $H_2$ gas to create additional defects in the additional dielectric film.

2. The method of claim 1, wherein the exposing the dielectric film to the plasma-excited treatment gas does not substantially change a physical thickness of the dielectric film.

3. The method of claim 1, wherein the dielectric film includes a metal oxide film selected from the group consisting of $HfO_2$, $ZrO_2$, $TiO_2$, $NiO$, $Al_2O_3$, $Ta_2O_5$, and laminate films thereof.

4. The method of claim 1, wherein the forming a plasma-excited treatment gas includes exciting the treatment gas using a microwave plasma source.

5. The method of claim 1, wherein the treatment gas consists of $H_2$ gas, or $H_2$ gas and Ar gas.

6. A method of forming a resistive random access memory (ReRAM) device, the method comprising:
- depositing a metal oxide dielectric film on a substrate, the metal oxide dielectric film containing intrinsic defects that include oxygen vacancies;
- forming a plasma-excited treatment gas containing $H_2$ gas, wherein the forming includes exciting the treatment gas using a microwave plasma source;
- exposing the metal oxide dielectric film to the plasma-excited treatment gas to create additional defects in the metal oxide dielectric film without substantially changing a physical thickness of the metal oxide dielectric film, wherein the additional defects lower the forming voltage needed for generating an electrically conducting filament across the metal oxide dielectric film;
- following the exposing the metal oxide dielectric film to the plasma-excited treatment gas, depositing an additional metal oxide dielectric film on the metal oxide dielectric film; and
- exposing the additional metal oxide dielectric film to additional plasma-excited treatment gas containing $H_2$ gas to create additional defects in the additional metal oxide dielectric film.

7. The method of claim 6, wherein the metal oxide dielectric film is selected from the group consisting of $HfO_2$, $ZrO_2$, $TiO_2$, $NiO$, $Al_2O_3$, $Ta_2O_5$, and laminate films thereof.

8. The method of claim 6, wherein the treatment gas consists of $H_2$, or $H_2$ and Ar.

9. The method of claim 6, wherein the substrate contains a first electrode film on a base material, the method further comprising:
- forming a second electrode film on the metal oxide dielectric film.

10. A resistive random access memory (ReRAM) device, comprising:
- a dielectric film on a substrate, the dielectric film containing intrinsic defects, and additional defects created by exposing the dielectric film to a plasma-excited treatment gas containing $H_2$ gas, wherein the additional defects in the dielectric film are created without substantially changing a physical thickness of the dielectric film, and wherein the additional defects lower the forming voltage needed for generating an electrically conducting filament across the dielectric film; and
- an additional dielectric film on the dielectric film, wherein the additional dielectric film contains intrinsic defects, and additional defects created by exposing the additional dielectric film to an additional plasma-excited treatment gas containing $H_2$ gas.

11. The device of claim 10, wherein the dielectric film contains a metal oxide film that is selected from the group consisting of $HfO_2$, $ZrO_2$, $TiO_2$, $NiO$, $Al_2O_3$, $Ta_2O_5$, and laminate films thereof.

12. The device of claim 10, wherein the treatment gas consists of $H_2$ gas, or $H_2$ gas and Ar gas.

13. The device of claim 10, wherein the substrate contains a first electrode film on a base material and the device further contains a second electrode film on the additional dielectric film.

14. The device of claim 10, wherein the plasma-excited treatment gas is excited using a microwave plasma source.

15. The device of claim 10, wherein the additional dielectric film contains a metal oxide film that is selected from the group consisting of $HfO_2$, $ZrO_2$, $TiO_2$, $NiO$, $Al_2O_3$, $Ta_2O_5$, and laminate films thereof.

16. The device of claim 10, wherein the dielectric film and the additional dielectric film both contain $HfO_2$.

17. The device of claim 10, wherein the additional treatment gas consists of $H_2$ gas, or $H_2$ gas and Ar gas.

* * * * *